US009411357B2

United States Patent
Cornu et al.

(10) Patent No.: US 9,411,357 B2
(45) Date of Patent: Aug. 9, 2016

(54) CHARGE TO VOLTAGE CONVERSION CIRCUIT FOR WIM SENSOR AND WIM SENSOR WITH SAME

(71) Applicant: KISTLER HOLDING AG, Winterthur (CH)

(72) Inventors: David Cornu, Bellinzona (CH); Adrian Hofmann, Ellikon am Rhein (CH); Leo Amstutz, Neftenbach (CH); Roman Strebel, Amlikon-Bissegg (CH); Claudio Cavalloni, Regensdorf (CH)

(73) Assignee: KISTLER HOLDING AG, Winterthur (CH)

( * ) Notice: Subject to any disclaimer, the term of this patent is extended or adjusted under 35 U.S.C. 154(b) by 106 days.

(21) Appl. No.: 14/385,587

(22) PCT Filed: Mar. 26, 2013

(86) PCT No.: PCT/CH2013/000051
§ 371 (c)(1),
(2) Date: Sep. 16, 2014

(87) PCT Pub. No.: WO2013/143013
PCT Pub. Date: Oct. 3, 2013

(65) Prior Publication Data
US 2015/0042304 A1 Feb. 12, 2015

(30) Foreign Application Priority Data

Mar. 26, 2012 (CH) ....................... 0424/12

(51) Int. Cl.
*G01G 3/13* (2006.01)
*G01G 19/02* (2006.01)
(Continued)

(52) U.S. Cl.
CPC .. *G05F 5/00* (2013.01); *G01G 3/13* (2013.01); *G01G 19/024* (2013.01); *G01D 3/036* (2013.01); *G01D 18/004* (2013.01); *G01L 1/16* (2013.01); *H03F 3/347* (2013.01); *H03F 3/70* (2013.01)

(58) Field of Classification Search
CPC ............. H03F 3/347; H03F 3/70; G01L 1/16; G01G 3/13; G01G 19/024; G05F 5/00; G01D 3/036; G01D 18/004
See application file for complete search history.

(56) References Cited

U.S. PATENT DOCUMENTS 3,569,747 A * 3/1971 Siegel ................... B06B 1/0651
310/319
3,749,946 A 7/1973 Von Rüti
(Continued)

FOREIGN PATENT DOCUMENTS

EP 0965827 A1 * 12/1999 ........... G01D 18/004

OTHER PUBLICATIONS

"Zener Diodes" article downloaded from the "All About Circuits" webpage (http://www.allaboutcircuits.com/textbook/semiconductors/chpt-3/zener-diodes/) on Feb. 26, 2016.*
(Continued)

*Primary Examiner* — Randy W Gibson
(74) *Attorney, Agent, or Firm* — Dority & Manning, P.A.

(57) ABSTRACT

An electronic circuit that changes a charge signal into a voltage signal within a sensor suitable for direct installation in a roadway can be connected to two single-core cables that need not be highly insulating yet can realize the required power supply of the electronics. The circuit includes an integrated impedance converter (IEPE) at the output to a two-core cable and a charge amplifier with an IC1 that has two inputs. A capacitor Cc is connected in series to the signal output of the sensor at one input of the IC1. A Zener diode D is arranged between the ground output of the sensor and the second input of the IC1 and can be supplied with power by a resistor R1 in conjunction with a power supply arranged on the output side in order to adapt the potential at the second input of the IC1.

14 Claims, 3 Drawing Sheets

(51) Int. Cl.
*G01L 1/16* (2006.01)
*G05F 5/00* (2006.01)
*H03F 3/70* (2006.01)
*H03F 3/347* (2006.01)
*G01D 18/00* (2006.01)
*G01D 3/036* (2006.01)

(56) References Cited

U.S. PATENT DOCUMENTS 4,009,447 A 2/1977 Wolf et al.
4,793,429 A * 12/1988 Bratton ................ G01G 19/035
 177/1
5,792,956 A 8/1998 Li
6,218,898 B1 * 4/2001 Zanetti .................. G01D 3/036
 310/311

OTHER PUBLICATIONS

International Preliminary Report on Patentability for PCT/CH2013/000051, issued Oct. 1, 2014.
International Search Report, issued Apr. 26, 2013.

* cited by examiner

CHARGE TO VOLTAGE CONVERSION CIRCUIT FOR WIM SENSOR AND WIM SENSOR WITH SAME

CROSS-REFERENCE TO RELATED APPLICATIONS

This application claims priority to International Application Serial No. PCT/CH2013/000051, filed Mar. 26, 2013, which claims priority to Swiss Application No. 00424/12 filed Mar. 26, 2012. International Application Serial No. PCT/CH2013/000051 is hereby incorporated herein for all purposes by this reference.

FIELD OF THE INVENTION

The invention pertains to an electronic circuit for converting a charge signal of a WIM (Weigh-In-Motion) sensor installed in a roadway into a voltage signal, as well as to a sensor that comprises such a circuit.

BACKGROUND

Force sensors for determining the weight of vehicles on the road while they travel over these sensors, namely so-called WIM (Weigh-In-Motion) sensors, are installed in a roadway such as, for example, a road and measure the dynamic ground reaction forces of the vehicles in order to determine their weight based on these forces. Piezoelectric sensors are typically used for this purpose. A signal in the form of a charge is generated in this case. It is common practice to transmit the charge to an external charge amplifier that converts the charge signal into a voltage signal via a cable. Since the charges are very low, the signal path up to the charge amplifier needs to be realized in a highly insulating fashion as it is always required for lines of piezoelectric sensors. This results in high costs because the highly insulating cables are very expensive. Long cables are frequently required in this application because the cabinet containing the electronics may be located far from the sensor in the road such that the costs of the system increase accordingly.

FIG. 1 shows a schematic representation of a roadway 6 in the form of a road with two rows of WIM (Weigh-In-Motion) sensors 3 that are integrated into the road. Analogous arrangements for rail vehicles are also conceivable, wherein the sensors 3 are in this case arranged, for example, in the rails. WIM sensors 3 typically contain piezoelectric sensor elements 3' (see FIG. 3) that deliver charge signals. These charge signals need to be transmitted via highly insulating cables 5 (see FIG. 1) before they are converted into voltage signals in corresponding electronics.

In the arrangement shown in FIG. 1, the WIM sensors 3 are used for determining the weights of the wheel loads of the vehicles traveling over the sensors. The measured results are transmitted to an evaluation unit in a cabinet 4 that is typically arranged very far from the road via a cable 5.

A charge amplifier 1 of the type normally used for such applications in the shown cabinets 4 is illustrated schematically in FIG. 2.

The sensor signal is fed to the charge amplifier 1 at the two inputs "In" and "GND" (ground) via a highly insulating coaxial cable 5 over a distance of several meters and converted into a voltage that can then be processed further in a relatively simple fashion (low-impedance signal processing). The charge amplifiers 1 are frequently accommodated in distant electronics cabinets on the side of the road.

The highly insulating connecting cable 5 from the sensor 3 to the charge amplifier 1 is very expensive and requires a very clean installation in order to prevent the cable 5 from being soiled and thereby compromising the required high insulation.

The cables 5 for transmitting the signals are connected to the two outputs "Out" and "GND." In addition, the charge amplifier 1 needs to be supplied with power via a two-core cable 5 such that a total of four cables 5 are connected to the charge amplifier 1. Depending on whether the charge amplifier 1 is accommodated in the sensor 3 or in the cabinet 4, either an expensive highly insulating cable 5 or an expensive four-core cable 5 needs to be installed between the sensor 3 and the cabinet 4.

The transmission of a voltage signal is much less problematic than that of a charge signal. If the sensor signal is already converted into a voltage signal in the sensor, the subsequent handling is significantly simplified, for example, because a less complex cable can be used.

Two established circuits are available for the conversion of a charge into a voltage signal. The first option in the form of a so-called IEPE circuit (Piezotron® available from Kistler Instrument Corp. of Amherst, N.Y.) has the advantage that it requires few components. Since the electronics are installed in the roadway together with the sensor in the described application of WIM sensors, a malfunction must be prevented in all circumstances because the sensor cannot be readily replaced. In this case, the roadway is impassable for a certain period of time and needs to be blocked off. Further requirements with respect to the quality of the sensor arise from the high temperature fluctuations and other environmental influences expected at the installation site. A small number of components contributes to realizing the electronics in a simple and therefore more durable fashion. A second advantage of an IEPE circuit can be seen in that a normal coaxial cable suffices for the signal transmission and the power supply if the charge signals are already converted into a voltage signal in the sensor.

Such an IEPE circuit according to the prior art is disclosed in FIGS. 7 and 8 of U.S. Pat. No. 4,009,447, which patent is hereby incorporated herein in its entirety by this reference for all purposes. The sensitivity of the signal respectively changes due to the high capacitance of the sensor and due to the change of this capacitance during temperature fluctuations such that the measuring results become less accurate.

Another example of an IEPE circuit is described in U.S. Pat. No. 5,792,956, which patent is hereby incorporated herein in its entirety by this reference for all purposes, but the ground output of the sensor does not have the same potential as the ground output of the amplifier in this case because a Zener diode is inserted. However, since the sensor ground needs to have the same potential as the output signal ground in a WIM sensor, this circuit cannot be used for the described purposes.

FIG. 3 shows an IEPE circuit 2 that is also referred to as a Piezotron® circuit and may be typically integrated into a sensor 3 of the described type, particularly a piezoelectric sensor 3. Aside from the measuring element, the sensor capacitance Cs and the insulation resistance of the sensor Rp are indicated in the sensor 3. The cable capacitance is indicated with the reference symbol Ck.

The centerpiece of the IEPE 2 is the impedance converter T2 that is arranged on the output side. It is connected to a two-core cable 5' (FIG. 3), into which a coupler is integrated for the power supply.

In both applications, no (quasi-)static measurements are required, which is the reason why both systems operate with time constants that result from the values of Cg and RT. In this way, a bottom limit of the frequency response is achieved.

In the IEPE circuit 2 schematically depicted in FIG. 2, the insulation resistance of the sensor Rp lies parallel to RT and therefore also influences the time constant.

The sensitivity of the measuring chain is in the IEPE circuit 2 defined by the capacitance Cg at the input, the sensor capacitance Cs and the input cable capacitance Ck.

In a WIM, the sensor capacitance Cs is high and, in particular, not stable over the service life due to temperature influences, manufacturing tolerances and other environmental influences. This massively affects the sensitivity of the measuring chain and practically makes it impossible to carry out an exact measurement.

The advantage of the IEPE circuit 2 can be seen in the simple signal transmission and power supply of the system by means of a cable pair 5'. The system is operated with a few mA by a power source and the signal is superimposed on a quiescent value (bias voltage) of ≈10 VDC in the form of a voltage value.

Nevertheless, an IEPE circuit cannot be used in the described application because the high capacitance and the internal resistance of the sensor are direct components of the circuit. However, the capacitance varies between the individual sensors such that each sensor has different signal characteristics. In addition, the resistance of each sensor changes over time such that the sensitivity of the signal also changes over time. An IEPE circuit consequently does not make it possible to obtain measuring results that have the required accuracy, particularly over a prolonged period of time.

The second option in the form of a charge amplifier does not have these disadvantages. However, a shielded two-core cable, which may be very long and therefore very expensive as described above, is required for the signal transmission and the power supply in this case. Consequently, this is not the desired solution. If the charge amplifier is directly installed into the sensor, an additional cable is required for the power supply such that the costs of the system are increased again.

Another charge amplifier according to the prior art is disclosed in FIGS. 10 and 11 of U.S. Pat. No. 4,009,447. In this arrangement, a voltage across the sensor is applied by a Zener diode, wherein this leads to a current flow through the sensor that has to be prevented by all means if the insulation deteriorates over time.

BRIEF SUMMARY OF THE INVENTION

The present invention is based on the objective of disclosing an electronic circuit that is capable of already carrying out a signal conversion of a charge signal into a voltage signal within the sensor and has a reliable and simple design suitable for direct installation in a roadway. In addition, it should be possible to connect the circuit to two single-core cables that do not have to be highly insulating and are capable of realizing the required power supply of the electronics. The circuit should furthermore have no influence on the sensor characteristics such as the capacitance and the resistance.

This objective is attained as described more fully below. The inventive circuit comprises a charge amplifier with an IC1 that has a first and a second input. These inputs serve as inputs of a sensor element that in turn has two outputs, namely a charge signal output and a ground output.

The circuit furthermore comprises an integrated impedance converter (IEPE) at the output to a two-core cable. According to the invention, a capacitor Cc is connected in series to the signal output of the sensor at the first input of the IC1 of the charge amplifier in order to decouple the internal DC voltage of the circuit across the sensor. In addition, a Zener diode D is arranged between the ground output of the sensor and the second input of the IC1 and can be supplied with power by a resistor R1 in conjunction with a power supply arranged on the output side in order to adapt the potential at the second input of the IC1.

This inventive circuit can be connected to a normal two-core cable. This cable makes it possible to transmit the signal data while a coupling ensures that the power supply of the circuit can be realized via the same two-core cable. In addition, the potential can be adapted without having to exchange components such that no roadway has to be blocked off for this purpose.

The transmission of the voltage signal is much less problematic than that of the charge signal. For example, a less complex and more cost-effective cable can be used for this purpose. In addition, the cable is less susceptible to damages during its installation and operation and, in contrast to a cable for charge signals, can also be used for the power supply. Instead of a complex charge amplifier, only simple signal processing is required in the cabinet.

BRIEF DESCRIPTION OF THE DRAWINGS

The invention is described in greater detail below with reference to the drawings. In these drawings.

DESCRIPTION OF EXEMPLARY EMBODIMENTS OF THE INVENTION

Figure 1:
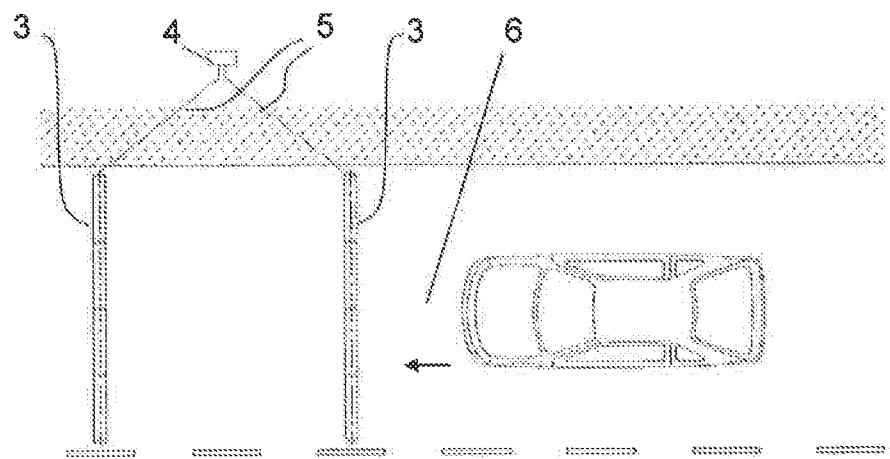
FIG. 1 shows an example of a WIM (Weigh-In-Motion) sensor in the installed state in a roadway with the cable leading to the cabinet.
Figure 2:
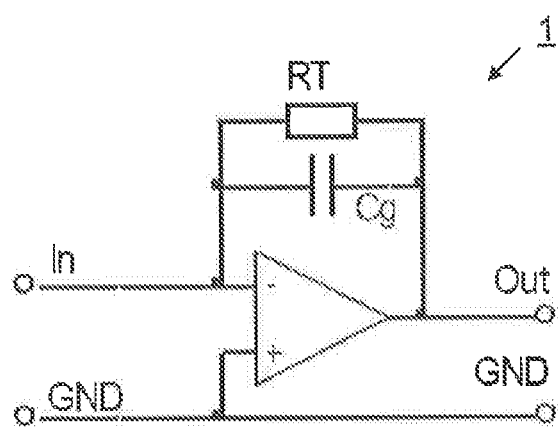
FIG. 2 shows a diagram of a conventional charge amplifier.
Figure 3:
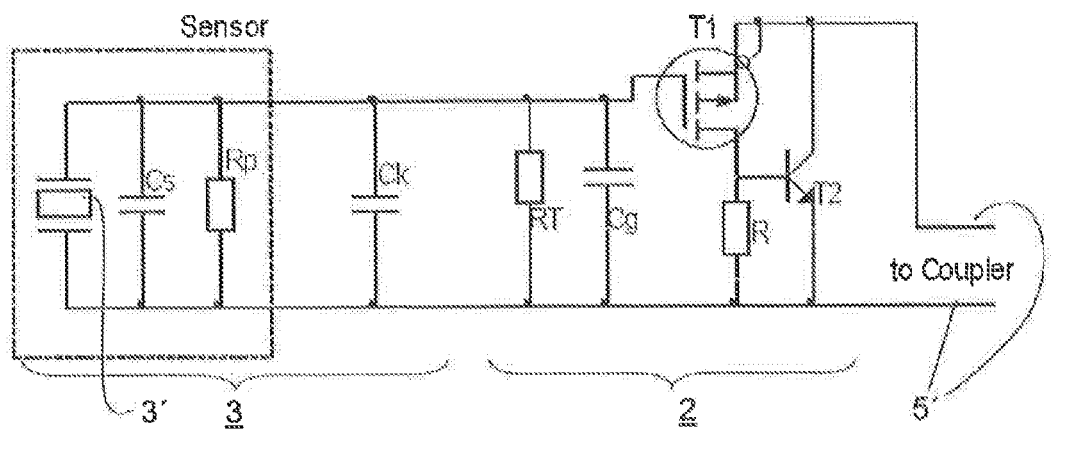
FIG. 3 shows a diagram of an IEPE circuit (Piezotron®) on a sensor.
Figure 4:
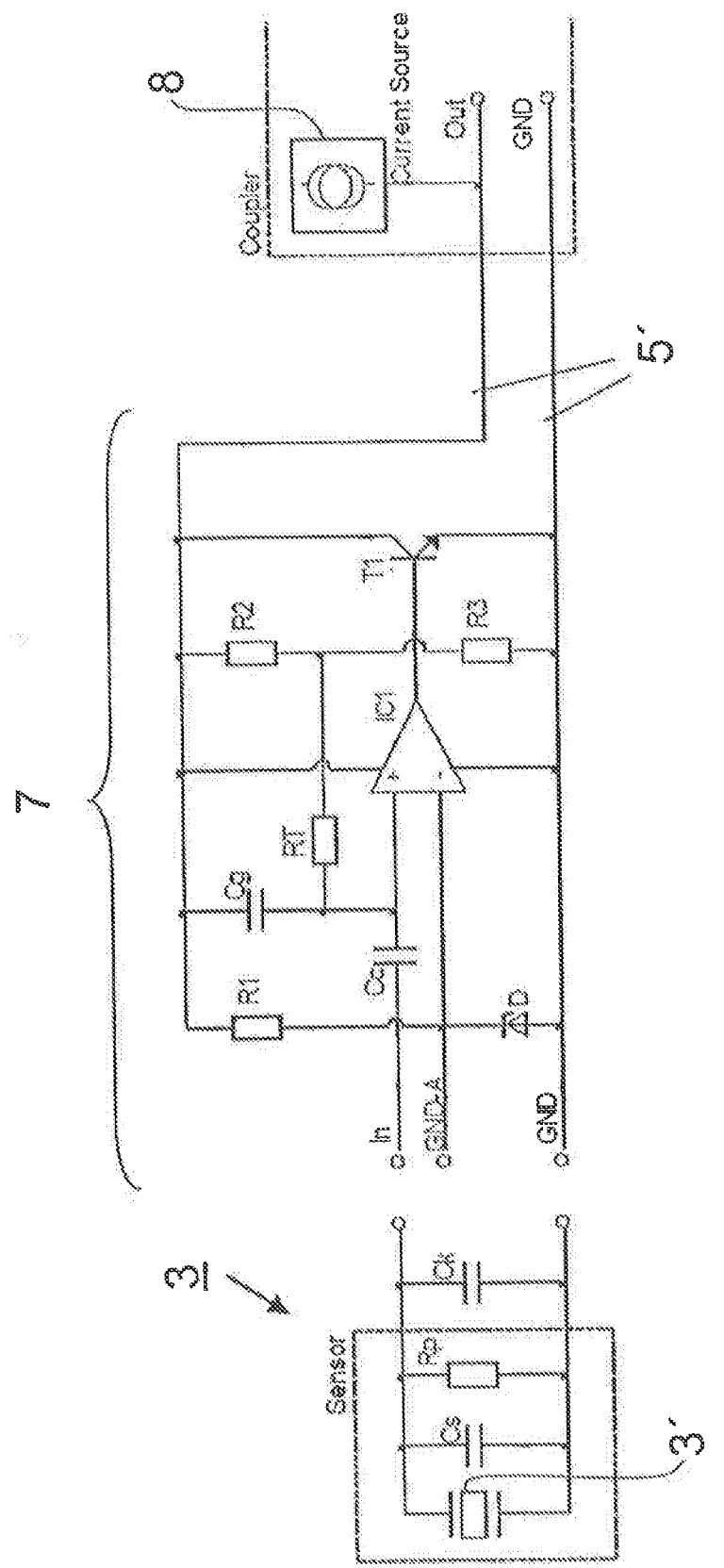
FIG. 4 shows an inventive circuit, as well as a sensor and a two-core cable with integrated power supply.

FIG. 4 shows the inventive electronic circuit 7 that is insensitive with respect to the varying sensitivity caused by the capacitance changes of the sensors 3.

The components IC1 (integrated circuit) and T1 (impedance converter) form the active amplifier stage. The Zener diode D defines the initial quiescent value or the bias voltage in conjunction with the resistors R2 and R3. The sensitivity of the measuring chain can be adjusted with the capacitance Cg. In addition, the resistor RT forms the time constant of the measuring signal in conjunction with the resistors R2, R3 and the capacitance Cg. The capacitor Cc serves for decoupling the voltage across the Zener diode D from the sensor 3.

The entire circuit 7 is supplied with power by a current source 8 that is accommodated in a so-called coupler (coupler).

The inventive circuit according to FIG. 4 combines the advantages of both systems: the sensitivity is nearly independent of the input capacitance analogous to the charge amplifier 1. The signal transmission and the power supply of the system can be realized with a cable pair 5' analogous to the IEPE circuit 2. In this case, the system is also operated with a few mA by a power source and the signal is superimposed on a quiescent value (bias voltage) of ≈10 VDC in the form of a voltage value.

In a WIM sensor 3, the sensor ground and the output signal ground GND have the same potential for constructive reasons.

In contrast to the charge amplifier 1, the sensor 3 is not connected between "In" and "GND-A." but rather needs to be connected to "GND."

Without the coupling capacitance (Cc is bypassed), the voltage of the Zener diode D lies parallel to the sensor 3.

In conjunction with the sensor insulation Rp, this results in an input current into the terminal "In" that manifests itself in the form of a quiescent voltage shift at the output, wherein this quiescent voltage shift may reach the limit such that a measurement would no longer be possible.

In order to solve this problem, the coupling capacitance Cc is connected to the input in order to thereby achieve a decoupling of the input voltage, which roughly equals a voltage across the diode D.

In this respect, it must be observed that the thusly created charge attenuator Cc and (Ck+Cs) is dimensioned accordingly such that the changes of Cs can be neglected.

The inventive electronic circuit 7 for converting a charge signal of a WIM (Weigh-In-Motion) sensor 3 that is installed in a roadway 6 and features a charge signal output and a ground output into a voltage signal comprises a charge amplifier with an IC1 that features a first and a second input as inputs of the sensor 3. It also comprises an integrated impedance converter (IEPE) with a voltage signal output "OUT" and a ground output "GND" at the output to a two-core cable 5'. According to the invention, a capacitor Cc is connected in series to the charge signal output of the sensor 3 "In" at the first input of the IC1 of the charge amplifier in order to decouple the internal DC voltage of the circuit across the sensor 3. In addition, a Zener diode D is arranged between the ground output of the sensor 3 "GND" and the second input of the IC1 and can be supplied with power via the two-core cable 5 by a resistor R1 in conjunction with a current supply 8 arranged on the output side in order to adapt the potential at the second input of the IC1. The ground output of the sensor particularly has the same potential as the ground output of the two-core cable 5'.

Two resistors R2, R3 can preferably be inserted parallel to the charge amplifier and the impedance converter, wherein said resistors define the quiescent output value in conjunction with the Zener diode D. In addition, a capacitance Cg is preferably arranged parallel to the + the IC1 of the charge amplifier as a feedback from the T1 output in order to adjust the sensitivity of the measuring chain. A resistor RT is preferably arranged to share a common potential with the + input of the IC1 of the charge amplifier, and in one sense Cg forms the time constant of the measuring signal in conjunction with the resistors R1 R2 and R3.

A two-core cable 5' with an external coupler as current source 8 is provided for the power supply at the output in this application. The two-core cable 5' may include a coaxial cable in this case.

According to the invention, the inventive circuit 7 comprises a sensor 3 on the input side, particularly a piezoelectric sensor 3. The invention particularly claims a sensor 3 with an inventive electronic circuit 7 according to the preceding description.

The circuit 7 is preferably integrated in the sensor 3. According to the invention, the sensor 3 is a Weigh-In-Motion (WIM) sensor 3 for carrying out dynamic axle load measurements on vehicles while they travel on a roadway 6.

LIST OF REFERENCE SYMBOLS

1 Charge amplifier
2 IEPE circuit, Piezotron®
3 Sensor, WIM sensors;
3' Sensor element
4 Cabinet
5 expensive, highly insulated Lines, cables
5' inexpensive lines not highly insulated, two-core cables
6 Roadway
7 Inventive electronic circuit
8 Power source, power supply

The invention claimed is:

1. An electronic circuit for converting a charge signal of a WIM (Weigh-In-Motion) sensor that is installed in a roadway and features a charge signal output and a ground output into a voltage signal, the electronic circuit comprising:
   a charge amplifier with an IC1 that features a first and a second input as inputs of the sensor,
   an integrated impedance converter (IEPE) T1 located at the output of the IC1 and connected to a two-core cable featuring a voltage signal output and a ground output,
   a capacitor is connected in series to the charge signal output of the sensor at the first input of the IC1 of the charge amplifier in order to decouple the internal DC voltage of the circuit across the sensor,
   a Zener diode arranged between the ground output of the sensor and the second input of the IC1 and connected to be supplied with power via the two-core cable through a resistor R1 to a current supply arranged on the output side in order to adapt the potential at the second input of the IC1,
   wherein the ground output of the sensor and the ground output of the two-core cable have the same potential.

2. The circuit according to claim 1, wherein two resistors R2, R3 are connected between the charge amplifier and the impedance converter and define the initial quiescent value in conjunction with the Zener diode.

3. The circuit according to claim 1, wherein a capacitance Cg is arranged parallel to the IC1 of the charge amplifier as a feedback in order to adjust the sensitivity of the measuring chain.

4. The circuit according to claim 3, wherein a resistor RT and the resistor R2 are arranged parallel to the capacitance Cg in the charge amplifier and form part of the time constant of the measuring signal, which time constant includes the resistors RT, R2 and R3.

5. The circuit according to claim 1, wherein the two-core cable with an external coupler as current source for the current supply is provided at the output.

6. The circuit according to claim 5, wherein the two-core cable consists of a coaxial cable.

7. The circuit according to claim 1, comprising a sensor on the input side.

8. The circuit according to claim 7, wherein the circuit is integrated in the sensor.

9. The circuit according to claim 7, wherein the sensor is a Weigh-In-Motion (WIM) sensor for carrying out dynamic axle load measurements on vehicles while they travel on a roadway.

10. The circuit according to claim 2, wherein a capacitance Cg is arranged parallel to the IC1 of the charge amplifier as a feedback in order to adjust the sensitivity of the measuring chain.

11. The circuit according to claim 2, wherein a resistor RT and the resistor R2 are arranged parallel to the capacitance Cg in the charge amplifier and the time constant of the measuring signal includes the resistors RT, R2 and R3.

12. The circuit according to claim 10, wherein a resistor RT and the resistor R2 are arranged parallel to the capacitance Cg in the charge amplifier and form part of the time constant of the measuring signal, which time constant includes the resistors RT, R2 and R3.

13. The circuit according to claim 1, further comprising a piezoelectric sensor on the input side.

14. The circuit according to claim 8, wherein the sensor is a Weigh-In-Motion (WIM) sensor for carrying out dynamic axle load measurements on vehicles while they travel on a roadway.

* * * * *